(12) United States Patent
Hays et al.

(10) Patent No.: US 10,240,960 B2
(45) Date of Patent: Mar. 26, 2019

(54) METHOD AND AN APPARATUS FOR REDUCING AN ERROR RATE

(71) Applicant: Micro Motion, Inc., Boulder, CO (US)

(72) Inventors: Paul J Hays, Lafayette, CO (US); Craig B McAnally, Thornton, CO (US)

(73) Assignee: Micro Motion, Inc., Boulder, CO (US)

( * ) Notice: Subject to any disclaimer, the term of this patent is extended or adjusted under 35 U.S.C. 154(b) by 151 days.

(21) Appl. No.: 15/519,783

(22) PCT Filed: Nov. 14, 2014

(86) PCT No.: PCT/US2014/065751
§ 371 (c)(1),
(2) Date: Apr. 17, 2017

(87) PCT Pub. No.: WO2016/076889
PCT Pub. Date: May 19, 2016

(65) Prior Publication Data
US 2017/0254690 A1    Sep. 7, 2017

(51) Int. Cl.
*G06F 19/00* (2018.01)
*G01F 15/02* (2006.01)
*G01F 1/84* (2006.01)
*G01R 19/25* (2006.01)

(52) U.S. Cl.
CPC .......... *G01F 15/022* (2013.01); *G01F 1/8431* (2013.01); *G01F 1/8436* (2013.01); *G01R 19/2509* (2013.01)

(58) Field of Classification Search
CPC .............................. G06F 15/022; G06F 1/8431
USPC ....................... 702/45, 50, 182–185
See application file for complete search history.

(56) References Cited

U.S. PATENT DOCUMENTS

| 5,585,753 A | 12/1996 | Ishiwata et al. |
| 5,736,653 A | 4/1998 | Drahm et al. |
| 2011/0307213 A1* | 12/2011 | Zhao ............. G01C 17/30 702/153 |
| 2013/0317760 A1 | 11/2013 | Kolahi et al. |

FOREIGN PATENT DOCUMENTS

JP    H08005402 A    1/1996

* cited by examiner

*Primary Examiner* — Edward Raymond
(74) *Attorney, Agent, or Firm* — The Ollila Law Group LLC

(57) ABSTRACT

A method for reducing an error rate is provided. The method includes obtaining a first analog signal representing a first kinematic property of a first position with a sensor, obtaining a second analog signal representing a second kinematic property of the first position, digitizing the first analog signal into a first digital signal, and digitizing the second analog signal into a second digital signal. The method also includes combining the first digital signal and the second digital signal into a combined signal such that an error rate of the combined signal is less than an error rate of one of the first digital signal and the second digital signal.

22 Claims, 7 Drawing Sheets

METHOD AND AN APPARATUS FOR REDUCING AN ERROR RATE

TECHNICAL FIELD

The embodiments described below relate to digital signal processing and, more particularly, to a method and an apparatus for reducing an error rate.

BACKGROUND

Sensors are often used to measure a motion of an object. For example, vibratory meters typically use sensors to measure the position, velocity, or acceleration of a tube. In particular, the vibratory meter can use a driver to vibrate the tube filled with material such as a fluid. The sensors can measure a movement of the tube to determine properties of the fluid in the tube. Motions of other objects can also be measured. For example, vibrations of a frame in a building or automobile, the sway of a rocker arm in a linkage system, or the like, can also be measured by the sensors. The motions of these objects can be sinusoidal. For example, the vibration of a tube can approximate one or more sinusoidal motions. The sinusoidal motion is typically described in terms of kinematic properties, such as the magnitude and frequency of the motion. The kinematic property can include the displacement, velocity, and acceleration of the motion.

A parameter of the signal, such as a voltage or current, provided by the sensor may be proportional to the kinematic property of the motion. For example, when velocity sensors are employed, the magnitude of the voltage can be correlated with the velocity of the sensor. As can be appreciated, other sensors can measure the displacement and acceleration of the objects. For example, displacement sensors can measure the displacement of an object away from a reference location. An accelerometer can measure the acceleration of the object. The sensors measuring these and other kinematic properties can provide a signal, which may be sinusoidal, comprised of sinusoidal components, or the like.

The signal can be digitized so digital signal processing can be performed to calculate the properties of the object or other properties, such as properties of the fluid in the vibrating meter's flow tube. Digitizing the signal can be comprised of sampling and encoding the signals. The samplings are typically voltage measurements that are performed at specific times, which may be periodic. In periodic sampling, the number of samples per unit time is commonly referred to as a sampling rate. The sampling rate is typically represented as fs=1/T, where T is the time-period between each sampling. Each sampling can be encoded with a byte representation that corresponds to the voltage of the sampling. The number of bits available for each encoding is known as the bit resolution. The sampling and encoding is typically done with an analog-to-digital converter (ADC).

As a result of the bit resolution, samples with different voltage values often have the same byte representation. For example, a sampling of 1.2 volts and a sampling of 1.01 volts may have the same byte representation. Digitizing the signal can therefore introduce an error in the digital signal. The error introduced during digitization is sometimes referred to as the quantization error. There are various methods to reduce or eliminate the error. These methods might include increasing the bit resolution, implementing companding algorithms, etc. However, such methods can consume limited processing resources and increase the cost and complexity of the electronics that perform the processing.

Accordingly, there is a need for a method and an apparatus for reducing the error rate. There is also a need to reduce the error rate while not consuming limited processing resources and without significantly increasing the cost and complexity of the meter electronics.

SUMMARY

A method for reducing an error rate is provided. According to an embodiment, the method comprises obtaining a first analog signal representing a first kinematic property of a first position with a sensor at the first position, obtaining a second analog signal representing a second kinematic property of the first position, digitizing the first analog signal into a first digital signal, digitizing the second analog signal into a second digital signal. The method further comprises combining the first digital signal and the second digital signal into a combined signal such that an error rate of the combined signal is less than an error rate of one of the first digital signal and the second digital signal.

An apparatus for reducing an error rate is provided. According to an embodiment, the apparatus comprises a sensor at a first position and a meter electronics coupled to and in communication with the sensor. The meter electronics is configured to obtain a first analog signal representing a first kinematic property of the first position from the sensor, obtain a second analog signal representing a second kinematic property of the first position, digitize the first analog signal into a first digital signal, digitize the second analog signal into a second digital signal. The meter electronics is also configured to combine the first digital signal and the second digital signal into a combined signal such that an error rate of the combined signal is less than an error rate of one of the first digital signal and the second digital signal.

ASPECTS

According to an aspect, a method for reducing an error rate comprises obtaining a first analog signal representing a first kinematic property of a first position with a sensor at the first position, obtaining a second analog signal representing a second kinematic property of the first position, digitizing the first analog signal into a first digital signal, digitizing the second analog signal into a second digital signal. The method also comprises combining the first digital signal and the second digital signal into a combined signal such that an error rate of the combined signal is less than an error rate of one of the first digital signal and the second digital signal.

Preferably, the step of obtaining the second analog signal comprises integrating the first analog signal with an analog integrator.

Preferably, the step of obtaining the second analog signal comprises obtaining the second analog signal with an additional sensor at the first position.

Preferably, the step of combining the first digital signal and the second digital signal comprises switching between the first digital signal and the second digital signal.

Preferably, the step of combining the first digital signal and the second digital signal comprises averaging a first value determined with one of the first digital signal and the second digital signal and a second value determined with the other of the first digital signal and the second digital signal.

Preferably, the method further comprises obtaining a third analog signal representing a first kinematic property of a second position with a sensor at the second position, obtaining a fourth analog signal representing a second kinematic property of the second position, digitizing the third analog signal into a third digital signal, digitizing the fourth analog signal into a fourth digital signal, and combining the third digital signal and the fourth digital signal into a combined signal such that an error rate of the combined signal is less than an error rate of one of the third digital signal and the fourth digital signal.

Preferably, the step of obtaining the fourth analog signal comprises integrating the third analog signal with an analog integrator.

Preferably, the step of obtaining the fourth analog signal comprises obtaining the fourth analog signal with an additional sensor at the second position.

Preferably, the first position and the second position are on a flow tube.

Preferably, the first analog signal is a velocity signal and the second analog signal is a position signal.

Preferably, the third analog signal is a velocity signal and the fourth analog signal is a position signal.

According to an aspect, an apparatus (500, 600) for reducing an error rate comprises a sensor (510a, 610) at a first position (130a), and a meter electronics (530, 630) coupled to and in communication with the sensor (510a, 610). The meter electronics (530, 630) is configured to obtain a first analog signal (512a, 612) representing a first kinematic property of the first position (130a) from the sensor (510a, 610), obtain a second analog signal (512b, 613) representing a second kinematic property of the first position (130a), digitize the first analog signal (512a, 612) into a first digital signal (514a, 614a), digitize the second analog signal (512b, 613) into a second digital signal (514b, 614b). The meter electronics (530, 630) is also configured to combine the first digital signal (514a, 614a) and the second digital signal (514b, 614b) into a combined signal (516, 616) such that an error rate of the combined signal (516, 616) is less than an error rate of one of the first digital signal (514a, 614a) and the second digital signal (514b, 614b).

Preferably, the meter electronics (630) obtains the second analog signal (613) by integrating the first analog signal (612) with an analog integrator (631a).

Preferably, the meter electronics (530) obtains the second analog signal (512b) from an additional sensor (510b) at the first position (130a).

Preferably, the meter electronics (530) combines the first digital signal (514a) and the second digital signal (514b) by switching between the first digital signal (514a) and the second digital signal (514b).

Preferably, the meter electronics (630) combines the first digital signal (614a) and the second digital signal (614b) by averaging a first value determined with one of the first digital signal (614a) and the second digital signal (614b) and a second value determined with the other of the first digital signal (614a) and the second digital signal (614b).

Preferably, the meter electronics (530, 630) is further configured to obtain a third analog signal (522a, 622) representing a first kinematic property of a second position (130b) with a sensor (520a) at the second position (130b), obtain a fourth analog signal (522b, 623) representing a second kinematic property of the second position (130b), digitize the third analog signal (522a, 622) into a third digital signal (524a, 624a), digitize the fourth analog signal (522b, 623) into a fourth digital signal (524b, 624b), and combine the third digital signal (524a, 624a) and the fourth digital signal (524b, 624b) into a combined signal (516, 616) such that an error rate of the combined signal (516, 616) is less than an error rate of one of the third digital signal (524a, 624a) and the fourth digital signal (524b, 624b).

Preferably, the meter electronics (630) obtains the fourth analog signal (623) by integrating the third analog signal (622) with an analog integrator (631b).

Preferably, the meter electronics (530) obtains the fourth analog signal (522b) with an additional sensor (520b) at the second position (130b).

Preferably, the first position (130a) and the second position (130b) are on a flow tube (130).

Preferably, the first analog signal (512a, 612) is a velocity signal and the second analog signal (512b, 613) is a position signal.

Preferably, the third analog signal (522a, 622) is a velocity signal and the fourth analog signal (522b, 623) is a position signal.

BRIEF DESCRIPTION OF THE DRAWINGS

The same reference number represents the same element on all drawings. It should be understood that the drawings are not necessarily to scale.

DETAILED DESCRIPTION

FIGS. 1-7 and the following description depict specific examples to teach those skilled in the art how to make and use the best mode of embodiments of a method and an apparatus for reducing an error rate. For the purpose of teaching inventive principles, some conventional aspects have been simplified or omitted. Those skilled in the art will appreciate variations from these examples that fall within the scope of the present description. Those skilled in the art will appreciate that the features described below can be combined in various ways to form multiple variations of the method and the apparatus for reducing the error rate. As a result, the embodiments described below are not limited to the specific examples described below, but only by the claims and their equivalents.

Figure 1:
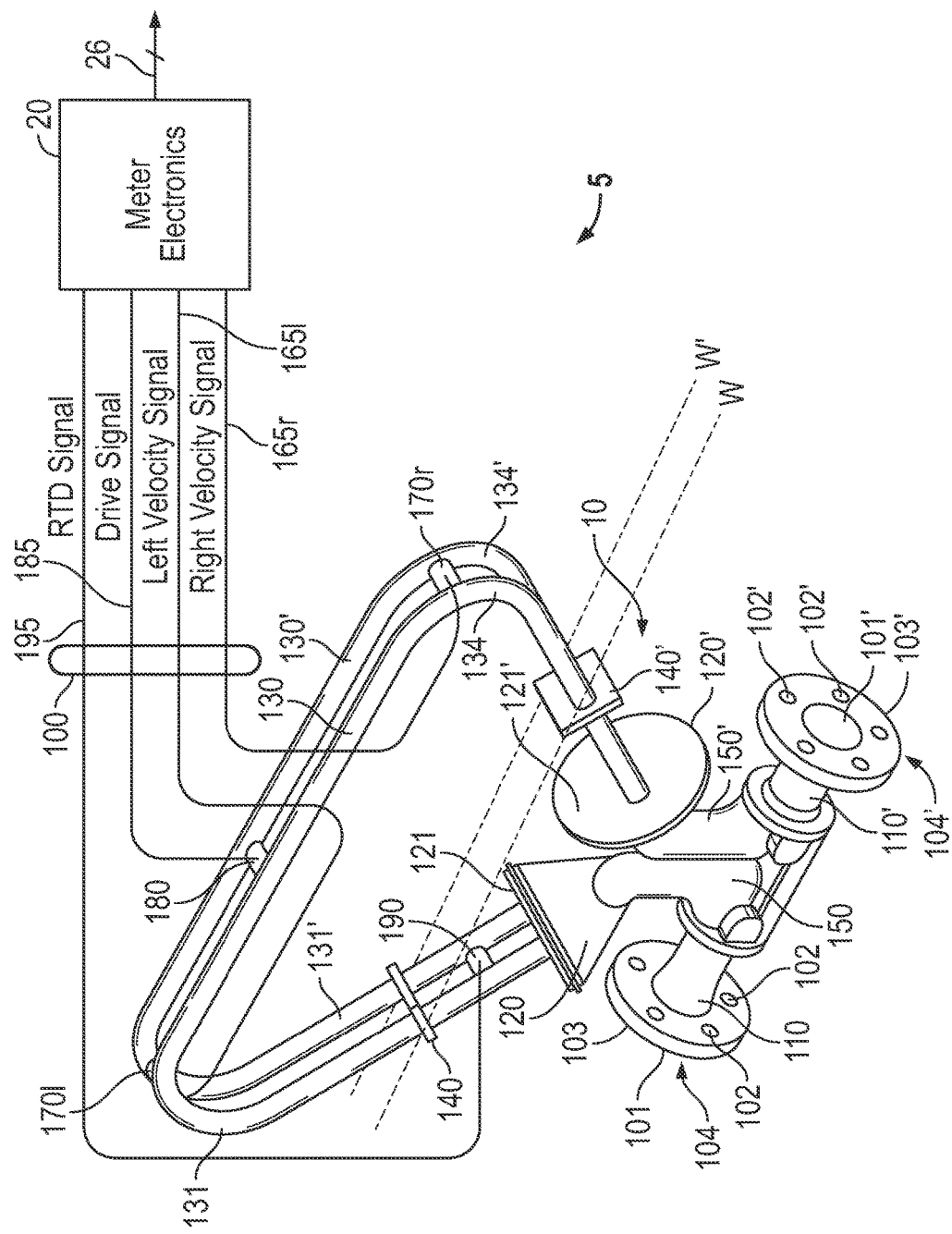
FIG. 1 shows a Coriolis flow meter 5 comprising a meter assembly 10 and meter electronics 20.

FIG. 1 shows a Coriolis flow meter 5 comprising a meter assembly 10 and meter electronics 20. The meter assembly 10 responds to mass flow rate and density of a process material. The meter electronics 20 is connected to the meter assembly 10 via leads 100 to provide density, mass flow rate, and temperature information over path 26, as well as other information. A Coriolis flow meter structure is described although it is apparent to those skilled in the art that the present invention could be practiced as a vibrating tube densitometer without the additional measurement capability provided by the Coriolis flow meter 5.

The meter assembly 10 includes a pair of manifolds 150 and 150', flanges 103 and 103' having flange necks 110 and 110', a pair of parallel flow tubes 130 and 130', drive mechanism 180, resistive temperature detector (RTD) 190, and a pair of velocity sensors 170l and 170r. Flow tubes 130 and 130' have two essentially straight inlet legs 131 and 131' and outlet legs 134 and 134' which converge towards each other at flow tube mounting blocks 120 and 120'. The flow tubes 130, 130' bend at two symmetrical locations along their length and are essentially parallel throughout their length. Brace bars 140 and 140' serve to define the axis W and W' about which each flow tube 130, 130' oscillates.

The side legs 131, 131' and 134, 134' of the flow tubes 130, 130' are fixedly attached to flow tube mounting blocks 120 and 120' and these blocks, in turn, are fixedly attached to manifolds 150 and 150'. This provides a continuous closed material path through Coriolis meter assembly 10.

When flanges 103 and 103', having holes 102 and 102' are connected, via inlet end 104 and outlet end 104' into a process line (not shown) which carries the process material that is being measured, material enters inlet end 104 of the meter through an orifice 101 in the flange 103 and is conducted through the manifold 150 to the flow tube mounting block 120 having a surface 121. Within the manifold 150 the material is divided and routed through the flow tubes 130, 130'. Upon exiting the flow tubes 130, 130', the process material is recombined in a single stream within the block 120' having a surface 121' and the manifold 150' and is thereafter routed to outlet end 104' connected by the flange 103' having bolt holes 102' to the process line (not shown).

The flow tubes 130, 130' are selected and appropriately mounted to the flow tube mounting blocks 120, 120' so as to have substantially the same mass distribution, moments of inertia and Young's modulus about bending axes W-W and W'-W', respectively. These bending axes go through the brace bars 140, 140'. Inasmuch as the Young's modulus of the flow tubes change with temperature, and this change affects the calculation of flow and density, RTD 190 is mounted to flow tube 130' to continuously measure the temperature of the flow tube 130'. The temperature of the flow tube 130' and hence the voltage appearing across the RTD 190 for a given current passing therethrough is governed by the temperature of the material passing through the flow tube 130'. The temperature dependent voltage appearing across the RTD 190 is used in a well-known method by the meter electronics 20 to compensate for the change in elastic modulus of the flow tubes 130, 130' due to any changes in flow tube temperature. The RTD 190 is connected to the meter electronics 20 by lead 195.

Both of the flow tubes 130, 130' are driven by drive mechanism 180 in opposite directions about their respective bending axes W and W' and at what is termed the first out-of-phase bending mode of the flow meter. This drive mechanism 180 may comprise any one of many well-known arrangements, such as a magnet mounted to the flow tube 130' and an opposing coil mounted to the flow tube 130 and through which an alternating current is passed for vibrating both flow tubes 130, 130'. A suitable drive signal is applied by the meter electronics 20, via lead 185, to the drive mechanism 180.

The meter electronics 20 receives the RTD signal on lead 195, and the left and right velocity signals appearing on leads 165l and 165r, respectively. The meter electronics 20 produces the drive signal appearing on lead 185 to drive mechanism 180 and vibrate tubes 130 and 130'. The meter electronics 20 processes the left and right velocity signals and the RTD signal to compute the mass flow rate and the density of the material passing through meter assembly 10. This information, along with other information, is applied by meter electronics 20 over path 26.

The foregoing described Coriolis flow meter 5 is provided as an exemplary application of reducing an error rate. However, reducing the error rate is applicable to any sensors measuring a kinematic property of any object. In the exemplary Coriolis flow meter 5, the left velocity signal or the right velocity signal can be the analog signal. The kinematic property is the velocity of the flow tube 130 near where the left or right velocity sensor 170l, 170r is attached. As will be described in more detail in the following, the meter electronics 20 can reduce the error in the digital signal.

Figure 2:
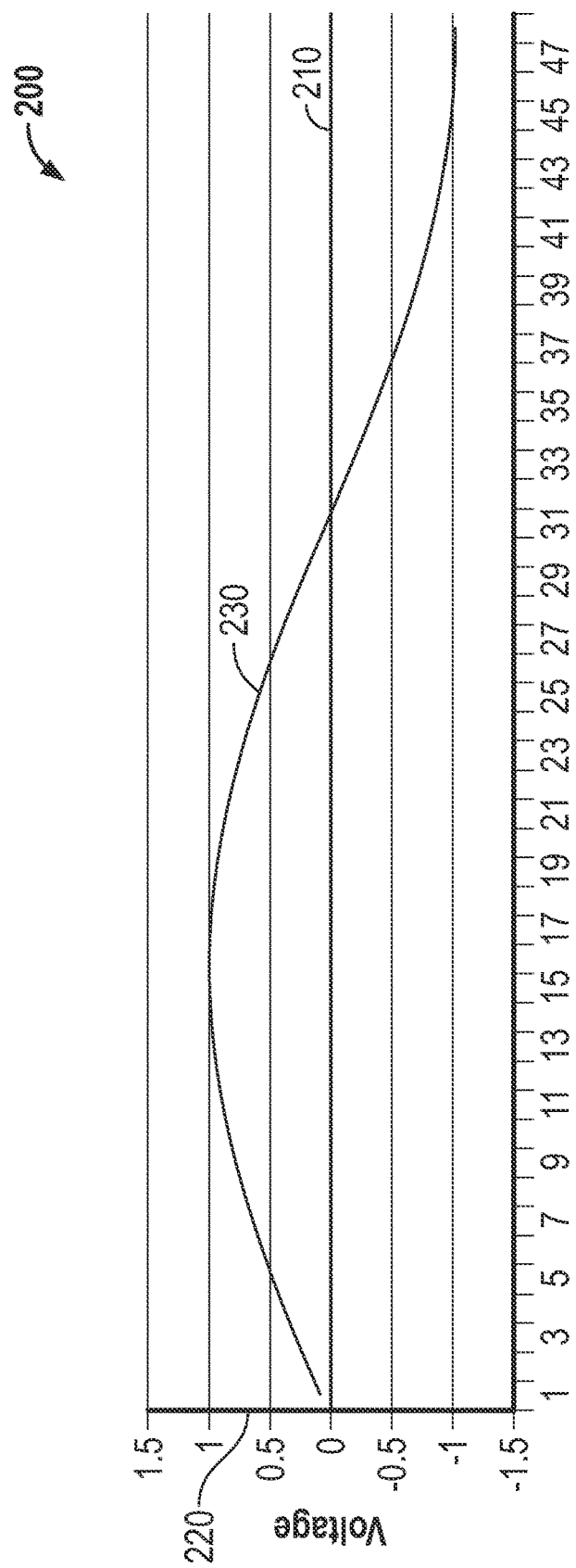
FIG. 2 shows a graph 200 with a plot of an analog signal according to an embodiment.

FIG. 2 shows a graph 200 with a plot of an analog signal according to an embodiment. The graph 200 includes a time axis 210 and a voltage axis 220 for illustrative purposes. Other units instead of voltage may be employed, such as current, power, or the like. The time axis 210 is denoted with numerals that represent a sequence of samplings. The graph 200 includes a first analog signal 230 that is a sinusoidal waveform. However, in alternative embodiments, different waveforms, such as complex signals composed of sinusoidal components, may be employed.

In the Coriolis flow meter 5 described with reference to FIG. 1, the first analog signal 230 can represent a kinematic property of the flow tube 130 near the left velocity sensor 170l or the right velocity sensor 170r. For example, the first analog signal 230 can be the left velocity signal from the left velocity sensor 170l described with reference to FIG. 1. That is, the kinematic property is the velocity of the flow tube 130 near the left velocity sensor 170l. However, in alternative embodiments, the kinematic property can be the position or acceleration of the flow tube 130 and can be measured at different locations on the flow tube 130. In these or alternative embodiments, the left and right sensors in the Coriolis flow meter 5 could be acceleration or position sensors, as will be explained in more detail in the following.

A sensor's velocity is related to the sensor's acceleration and position. For example, the velocity of the sensor is related to the position as a time rate of change of the position of the sensor. Mathematically, this can be represented as:

$$v(t) = \frac{dx(t)}{dt} \tag{1}$$

where x is a position axis on the sensor. The position axis may be chosen to be in the direction of the vibration of the sensor. In the Coriolis flow meter 5 described with reference to FIG. 1, the position x can be the axis of vibration of either the left or the right velocity sensor 170l and 170r. Since the pair of velocity sensors 170l and 170r measure the velocity of their respective positions, the positions can be determined by integrating equation (1). Similarly, the acceleration a of the sensor can be related to the velocity v and position x of the sensor through the following equation:

$$a(t) = \frac{dv(t)}{dt} = \frac{dx^2(t)}{dt^2}. \tag{2}$$

In equation (2) the acceleration a, the velocity v, and the position x are kinematic properties of the sensor, or the object the sensor is coupled to, that is providing the analog signal. As will be described in more detail in the following, the foregoing discussed relationships between the kinematic properties can be utilized to reduce error rates, such as quantization error rates, that are introduced during the digitization of the analog signals 230, 330.

Figure 3:
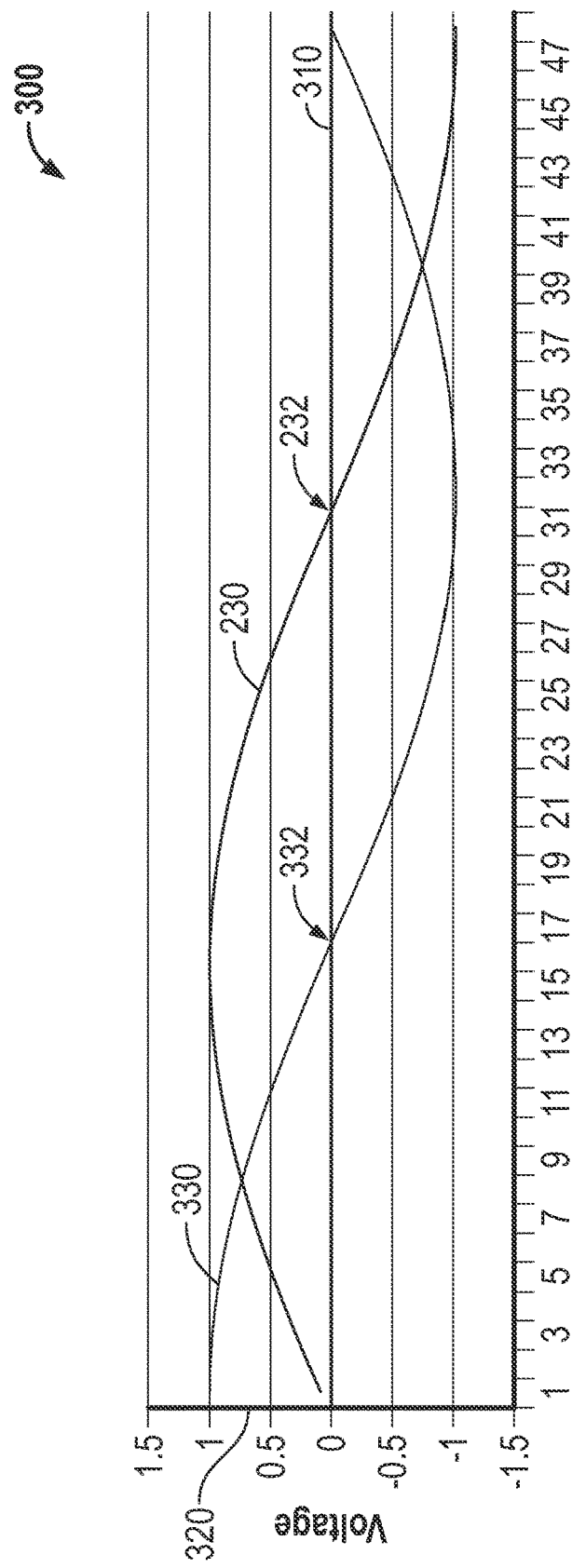
FIG. 3 shows a graph 300 with the first analog signal 230 and a second analog signal 330 according to an embodiment.

FIG. 3 shows a graph 300 with the first analog signal 230 and a second analog signal 330 according to an embodiment.

As shown in FIG. 3, the graph 300 includes a time axis 310 and a voltage axis 320. The time axis 310 is denoted with numerals that represent a sequence of samplings. As can be seen, the second analog signal 330 appears similar to the first analog signal 230 with a 90 degree phase delay. The 90 degree phase delay can be due to the relationship between velocity and the position of the left velocity sensor 170l described with reference to FIG. 1.

The first and second analog signal 230, 330 also include a first and second zero crossing point 232, 332, respectively. The zero crossing points 232, 332 are where the analog signals 230, 330 cross the time axis 310. As can be seen, the region around the zero crossing points 232, 332 have a larger slope than the other regions of the analog signals 230, 330. The error rate in the region around the zero crossing points 232, 332 can be lower than around the maximum and minimum of the analog signals 230, 330, as will be explained in more detail in the following.

Figure 4:
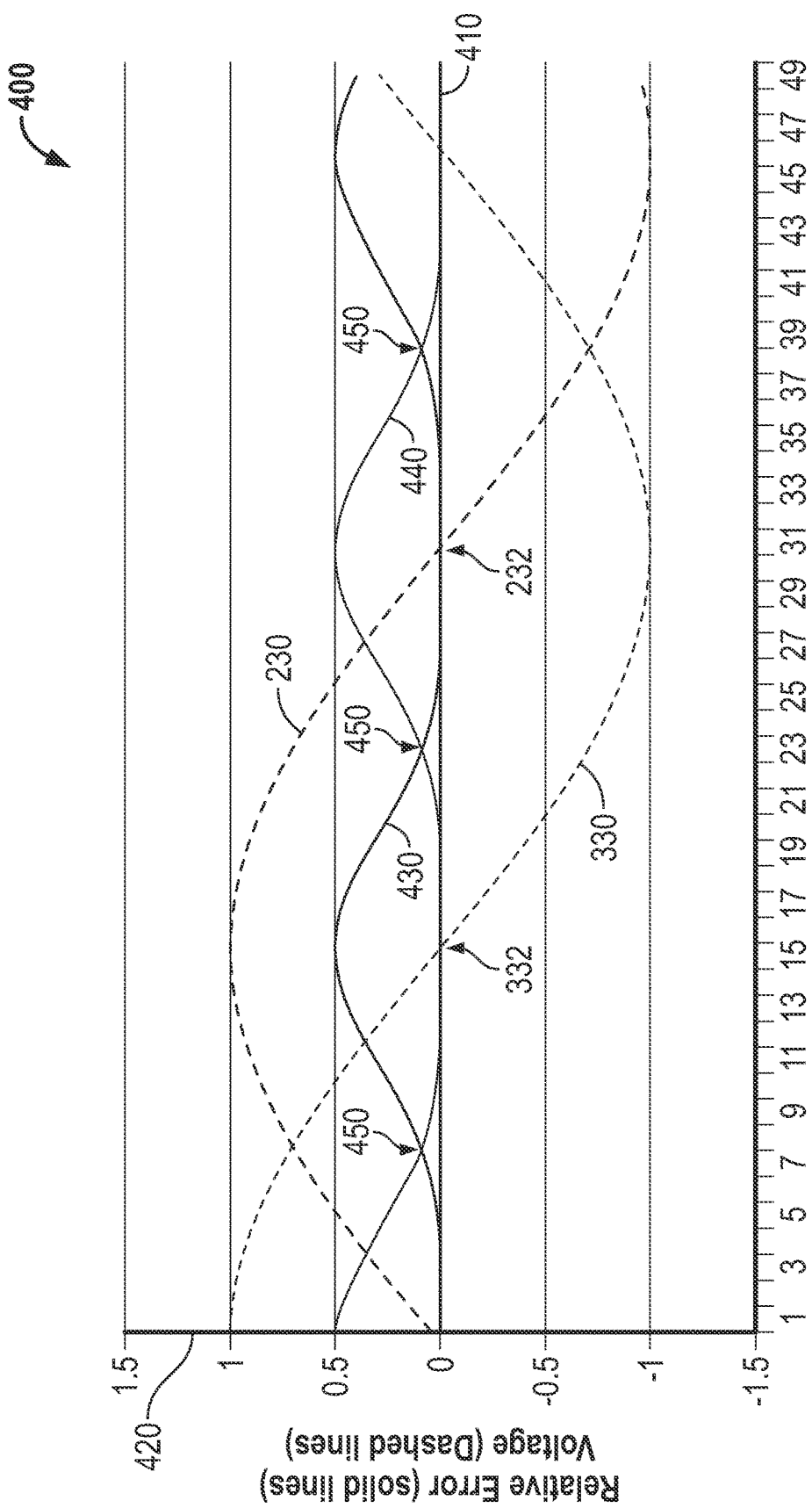
FIG. 4 shows the graph 400 illustrating error rates introduced when the first and second analog signal 230, 330 are digitized.

FIG. 4 shows the graph 400 illustrating error rates introduced when the first and second analog signal 230, 330 are digitized. The graph 400 includes a time axis 410 and a voltage/relative error axis 420. As shown in FIG. 4, the error rates are illustrated by a first error rate waveform 430 and a second error rate waveform 440. The first error rate waveform 430 is associated with and represents the error rate of the first analog signal 230. The second error rate waveform 440 is associated with and represents the error rate of the second analog signal 330. The error rate waveforms 430, 440 can be an absolute value of a difference between the analog signals 230, 330 and digital signals that represent the analog signals 230, 330. Also shown is a plurality of error crossing points 450. The plurality of error crossing points 450 are where the first and second error rate waveform 430, 440 cross each other.

As can be appreciated, the first error rate waveform 430 has a maximum at about the same time where the first analog signal 230 has a maximum. The maximum in the first error rate waveform 430 can be due to a quantization error that increases as the slope of the first analog signal 230 decreases. For example, the voltage changes in the analog signals 230, 330 can be minimal around the maximum and minimum values of the analog signals 230, 330. Accordingly, the error rate is at a maximum where the slope of the first analog signal 230 is about zero. As can also be appreciated, the maximums in the first error rate waveform 430 are offset along the time axis 410 from the maximums in the second error rate waveform 440. The offset can be utilized to reduce an error rate.

For example, a composite of the error rate waveforms 430, 440 can have a lower maximum error rate than the error rates in the first and second analog signal 230, 330. Moving from the left to the right of the graph 400, one can appreciate that the first error rate waveform 430 has a lower error rate than the second error rate waveform 440 until one of the plurality of error crossing points 450. Moving further to the right, the second error rate waveform 440 has a lower error rate than the first error rate waveform 430 until another one of the plurality of error crossing points 450. In one exemplary embodiment, the composite of the first and second error rate waveform 430, 440 can be generated by switching between the first and second analog signal 230, 330 at each of the plurality of error crossing points 450. Accordingly, the composite of the error rate waveforms 430, 440 can be comprised of the lowest error rate portions of the error rate waveforms 430, 440. However, in alternative embodiments, the composite can be comprised of other portions of the error rate waveforms 430, 440 by, for example, performing other operations, such as averaging.

As the foregoing discussion illustrates, the error rate can be reduced by combining the digital representations of the analog signals 230, 330. For example, the maximum error rate can be reduced by combining digital signals obtained from the digitization of the first and second analog signal 230, 330, as will be described in more detail in the following.

Figure 5:
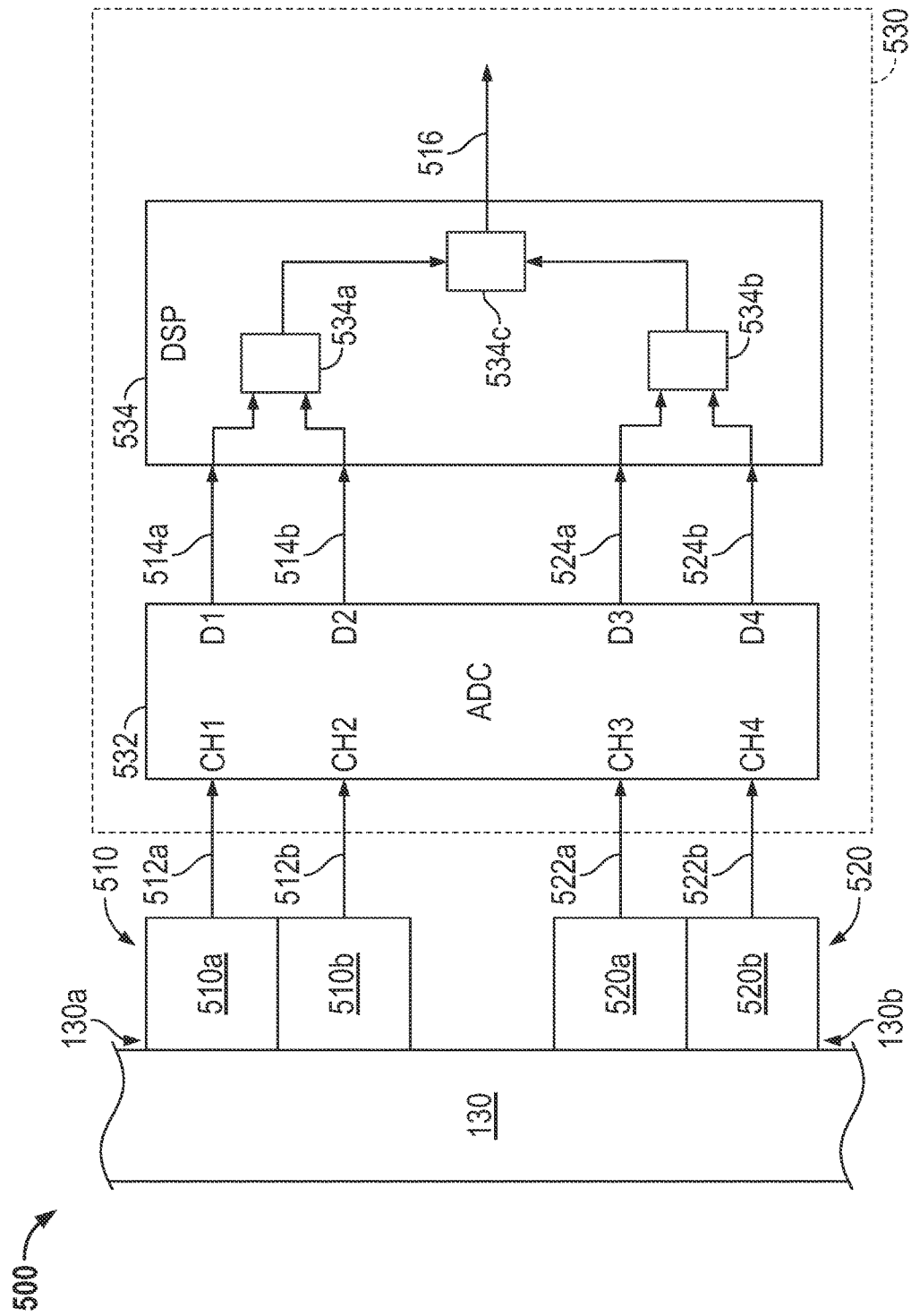
FIG. 5 shows a block diagram of an apparatus 500 for reducing an error rate.

FIG. 5 shows a block diagram of an apparatus 500 for reducing an error rate. In the embodiment shown, the apparatus 500 includes a first sensor pair 510 and a second sensor pair 520. The first sensor pair 510 can be comprised of, for example, a first sensor 510a and a second sensor 510b. The second sensor pair 520 can be comprised of a third sensor 520a and a fourth sensor 520b. However, in alternative embodiments, the first and second sensor pair 510, 520 can be comprised of more or fewer sensors and can be coupled to the flow tube 130 at alternative locations.

The sensor pairs 510, 520 are also shown as coupled to the flow tube 130 described with reference to FIG.1. In the embodiment shown, the first and second sensor 510a, 510b are coupled to the flow tube 130 at a first position 130a on the flow tube 130, which may correspond to the left velocity sensor 170l shown in FIG. 1. The third and fourth sensor 520a, 520b are coupled to the flow tube 130 at a second position 130b, which may correspond to the right velocity sensor 170r shown in FIG. 1. The sensor pairs 510, 520 are also shown as being in communication with meter electronics 530 via a first analog signal 512a, a second analog signal 512b, a third analog signal 522a, and a fourth analog signal 522b. The analog signals 512a, 512b, 522a, 522b can be obtained from the sensors 510a, 510b, 520a, 520b. The analog signals 512a, 512b, 522a, 522b can represent kinematic properties of the flow tube 130.

For example, the first and second analog signals 512a, 512b of the first sensor pair 510 can represent the velocity and displacement of the flow tube 130 at the first position 130a. The third and fourth analog signals 522a, 522b can represent the velocity and displacement of the flow tube 130 at the second position 130b. In an embodiment, the first and third sensor 510a, 520a can be velocity sensors that measure the velocity of the flow tube 130 at the first and second position 130a, 130b. The second and fourth sensor 510b, 520b can be displacement sensors that measure the displacement of the flow tube 130 at the first and second position 130a, 130b. Accordingly, the first analog signal 512a from the first sensor pair 510 can represent the velocity of the flow tube 130 at the first position 130a on the flow tube 130. The second analog signal 512b can represent the displacement of the first sensor pair 510 at the first position 130a on the flow tube 130. Similarly, the velocity and displacement of the flow tube 130 at the second position 130b on the flow tube 130 can be represented by the third and fourth analog signal 522a, 522b in the second sensor pair 520. However, the analog signals 512a, 512b, 522a, 522b can represent any kinematic property of the flow tube 130 in alternative embodiments. These and other analog signals can be provided to the meter electronics 530.

The meter electronics 530 is shown as including an analog-to-digital converter (ADC) 532. In particular, the ADC 532 includes four channels CH1-CH4 that receive the analog signals 512a, 512b, 522a, 522b from the sensor pairs 510, 520. As shown, the first channel CH1 receives the first analog signal 512a from the first sensor 510a and the second channel CH2 receives the second analog signal 512b from the second sensor 510b. Similarly, the third channel CH3 receives the third analog signal 522a from the third sensor 520a and the fourth channel CH4 receives the fourth analog signal 522b from the fourth sensor 520b.

The ADC 532 digitizes the analog signals 512a, 512b, 522a, 522b into a first digital signal 514a, a second digital signal 514b, a third digital signal 524a, and a fourth digital signal 524b. In the embodiment shown, the first analog signal 512a is digitized into the first digital signal 514a, the second analog signal 512b is digitized into the second digital signal 514b, the third analog signal 522a is digitized into the third digital signal 524a, and the fourth analog signal 522b is digitized into the fourth digital signal 524b. The ADC 532 can digitize the analog signals 512a, 512b, 522a, 522b by sampling and encoding the analog signals 512a, 512b, 522a, 522b. Although one ADC 532 is shown, more analog-to-digital converters can be employed in alternative embodiments. Additionally or alternatively, the ADC 532 can have different numbers of channels. For example, two dual channel analog-to-digital converters can be employed in an alternative embodiment. In the embodiment shown, the digital signals 514a, 514b, 524a, 524b can be provided via digital channels D1-D4.

The meter electronics 530 is also shown as including a DSP block 534. The DSP block 534 can be comprised of one or more of any appropriate DSP module, chip, function, chain, or the like. The DSP block 534 is coupled to and in communication with the ADC 532 via the first digital signal 514a, the second digital signal 514b, the third digital signal 524a, and the fourth digital signal 524b. Also shown in FIG. 5 is a first switch 534a and a second switch 534b in the DSP block 534. The DSP block 534 also includes a DSP function 534c, which can perform one or more digital signal processing steps (e.g., Hilbert transforms, decimation, summing, filtering, etc.).

The DSP block 534 receives the digital signals 514a, 514b, 524a, 524b, performs digital signal processing, and outputs a combined signal 516. The digital signal processing can be performed by the DSP function 534c although any other part of the DSP block 534 can perform the digital signal processing steps. In the embodiment shown, the DSP function 534c can determine a phase difference between two of the digital signals 514a, 514b, 524a, 524b and output the combined signal 516. The combined signal 516 can be a digital signal that represents a property of the fluid in the flow tube 130 based on the determined phase difference. For example, the combined signal 516 can represent the flow rate, density, or the like, of the fluid in the flow tube 130.

The first and second switches 534a and 534b, respectively, switch between the first and second digital signal 514a, 514b and the third and fourth digital signal 524a, 524b. For example, the first switch 534a can select the first digital signal 514a and the second switch 534b can select the third digital signal 524a. The first and second switch 534a and 534b can switch such that the second digital signal 514b and the fourth digital signal 524b are selected. The switching between the digital signals 514a, 514b, 524a, 524b can occur simultaneously, at different times, with a predetermined time delay, etc. The switching between the digital signals 514a, 514b, 524a, 524b can also be coordinated. For example, the first switch 534a and the second switch 534b can be in communication through the DSP block 534.

Due to the digitization of the analog signals 512a, 512b, 522a, 522b into the digital signals 514a, 514b, 524a, 524b, the digital signals 514a, 514b, 524a, 524b have an error rate. For example, the digital signals 514a, 514b, 524a, 524b are typically maximum and minimum about where the analog signals 512a, 512b, 522a, 522b are maximum or minimum. Accordingly, similar to the error rate waveforms 430, 440 discussed with reference to FIG. 4, the error rates in the digital signals 514a, 514b, 524a, 524b may be maximum about where the digital signals 514a, 514b, 524a, 524b are maximum or minimum.

The error rate can be reduced by combining the digital signals 514a, 514b, 524a, 524b. For example, the flow rate of the fluid can be determined by a phase difference between the first digital signal 514a and the third digital signal 524a when the first digital signal 514a and the third digital signal 524a are near their zero crossing points. In an embodiment, the switches 534a, 534b can switch to the second and fourth digital signal 514b, 524b as the amplitude of the first digital signal 514a and the third digital signal 524a increase from their zero crossing points. After switching to the second and fourth digital signal 514b, 524b, the DSP function 534c can continue determining the phase difference with the second digital signal 514b and the fourth digital signal 524b.

As can be appreciated, the switching between the digital signals 514a, 514b, 524a, 524b can be timed such that combined signal 516 is comprised of the regions around the zero crossing points of the digital signals 514a, 514b, 524a, 524b. For example, the switches 534a, 534b can select the first and third digital signal 514a, 524a while the first and third digital signal 514a, 524a are in the region around the zero crossing point. The switches 534a, 534b can switch to the second and fourth digital signal 514b, 524b as the first and third digital signal 514a, 524a enter their maximum and minimum regions. The regions can be determined by various methods, such as comparing the magnitude or slope of the first and third digital signal 514a, 524b to a threshold. The switches 534a, 534b can also switch when the digital signals 514a, 514b, 524a, 524b cross. For example, the first switch 534a can switch between the first and second digital signal 514a, 514b when the magnitudes of the first and second digital signal 514a, 514b are equal.

In the foregoing described and other embodiments, the first switch 534a can switch to the second digital signal 514b about where the error rates of the first digital signal 514a and the second digital signal 514b cross. Similarly, the second switch 534b can switch to the fourth digital signal 524b at about the crossing points of the error rates of the third digital signal 524a and the fourth digital signal 524b. After switching the first and third digital signal 514a, 524a to the second and fourth digital signal 514b, 524b, the combined signal 516 can be determined from a phase difference between the second digital signal 514b and the fourth digital signal 524b.

As can be appreciated, the switching between the first digital signal 514a and the second digital signal 514b and between the third digital signal 524a and the fourth digital signal 524b can reduce the error rate. For example, switching where the first digital signal 514a and the second digital signal 514b are equal to each other can ensure that the phase difference is determined with low error rate portions of the digital signals 514a, 514b, 524a, 524b. Accordingly, the combined signal 516 has a reduced error rate.

The foregoing describes an embodiment where a second analog signal 512b is obtained from a second sensor 510b. The foregoing also illustrates where the digital signals 514a, 514b, 524a, 524b are switched to reduce the error rate. However, a second analog signal can be obtained and digital signals can be combined with other apparatuses. An exemplary embodiment with an alternative apparatus is discussed in the following with reference to FIG. 6.

Figure 6:
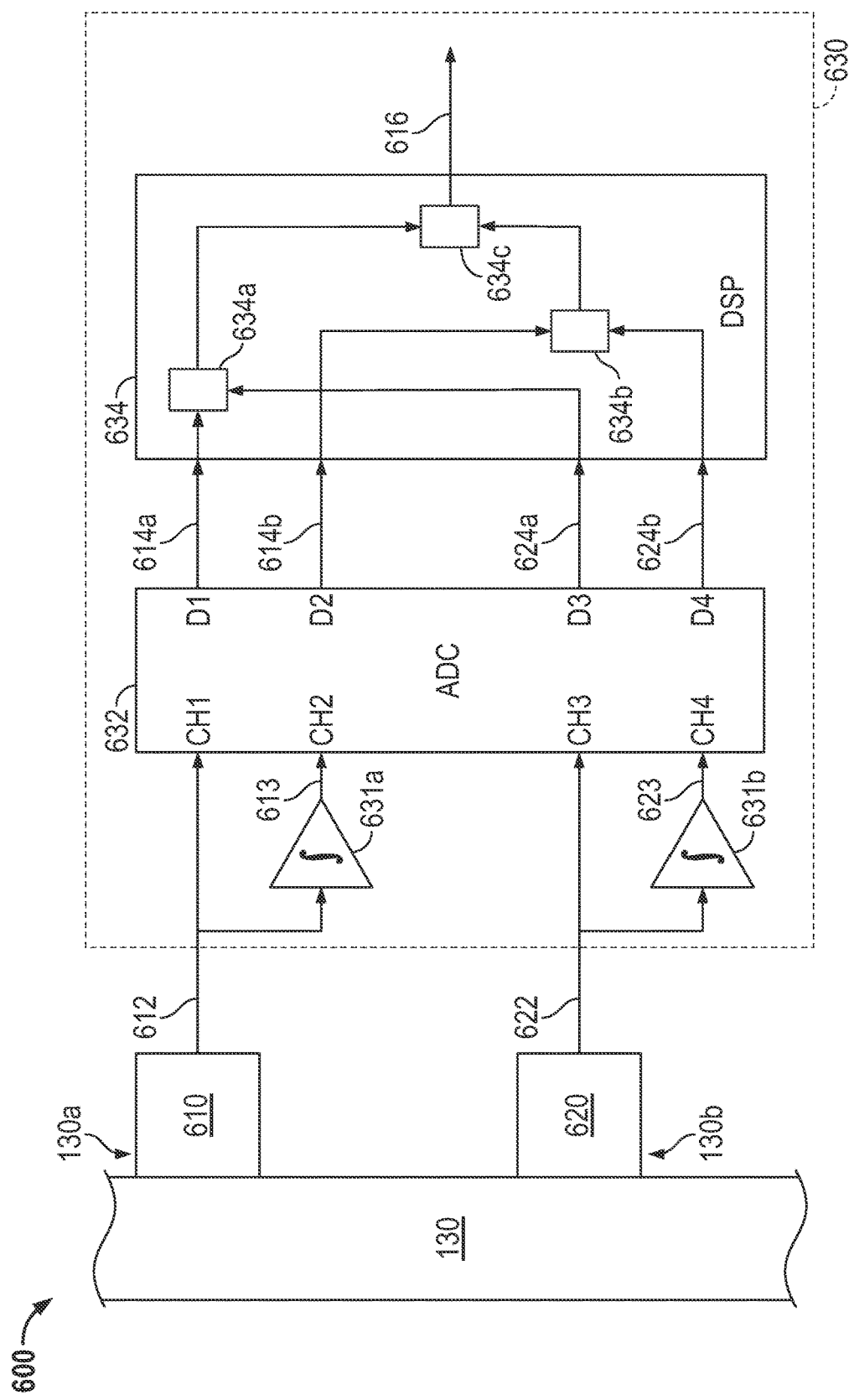
FIG. 6 shows a block diagram of an apparatus 600 for reducing an error rate.

FIG. 6 shows a block diagram of an apparatus 600 for reducing an error rate. In the embodiment shown, the apparatus 600 includes a first sensor 610 and a second sensor 620. In contrast to the embodiment described in the foregoing with reference to FIG. 5, each of the sensors 610, 620 is comprised of a single sensor respectively coupled to the first and second position 130a, 130b on the flow tube 130. In alternative embodiments, the first and second sensor 610, 620 can be coupled to the flow tube 130 at alternative locations. The first and second sensor 610, 620 are also shown as coupled to and in communication with meter electronics 630 via the first and third analog signal 612, 622, respectively.

In the embodiment shown, the first and third analog signal 612, 622 are respectively provided to a first and second analog integrator 631a, 631b. The analog integrators 631a, 631b perform an analog integration on the first and third analog signal 612, 622 to obtain a second and fourth analog signal 613, 623. In alternative embodiments, different operations can be performed on the first and third analog signal 612, 622. For example, a differentiation may be performed on the first and third analog signal 612, 622.

Where the sensors 610, 620 are velocity sensors, the first and third analog signal 612, 622 can respectively represent the velocity of the first and second position 130a, 130b on the flow tube 130. Accordingly, due to the integration performed by the analog integrators 631a, 631b, the second and fourth signal 613, 623 can represent the position of the first and second sensor 610, 620. In the embodiment where the first and third analog signal 612, 622 are differentiated, the second and fourth analog signal 613, 623 can respectively represent the acceleration of the first and second position 130a, 130b. However, the analog signals 612, 613, 622, 623 can represent any kinematic property of the flow tube 130. The analog signals 612, 613, 622, 623 are shown as being provided to the analog integrators 631a, 631b in the meter electronics 630. However, in alternative embodiments, the analog integrators 631a, 631b may not be in meter electronics. For example, alternative analog integrators may be part of the sensors.

In the embodiment shown, the meter electronics 630 also includes an ADC 632. The ADC 632 includes four channels CH1-CH4 that receive the first and third analog signal 612, 622 from the first and second sensor 610, 620 and the second and fourth analog signals 613, 623 from the analog integrators 631a, 631b. As shown, the first channel CH1 receives the first analog signal 612 from the first sensor 610 and the second channel CH2 receives the second analog signal 613 from the first analog integrator 631a. Similarly, the third channel CH3 receives the third analog signal 622 from the second sensor 620 and the fourth channel CH4 receives the fourth analog signal 623 from the second analog integrator 631b. However, in alternative embodiments, the analog signals 612, 613, 622, 623 can be provided to alternative channels.

The meter electronics 630 is also shown as including a DSP block 634. The DSP block 634 can be comprised of one or more of any appropriate DSP module, chip, function, chain, or the like. The DSP block 634 is shown as coupled to and in communication with the ADC 632 via the digital signals 614a, 614b, 624a, 624b. The DSP block 634 receives and combines the digital signals 614a, 614b, 624a, 624b into the combined signal 616. The DSP block 634 combines the digital signals 614a, 614b, 624a, 624b with the first and second DSP function 634a, 634b and the averaging function 634c. Although the DSP functions 634a, 634b and the averaging function 634c are described as performing particular DSP functions, alternative embodiments of, for example, the averaging function 634c may include functions other than averaging.

In the embodiment shown in FIG. 6, the DSP block 634 can combine the digital signals 614a, 614b, 624a, 624b with various methods. For example, in the embodiment shown in FIG. 6, the first digital signal 614a and the third digital signal 624a can be processed with the first DSP function 634a to determine a first value, such as a first phase difference. The first phase difference may be proportional to, for example, a flow rate of the fluid in the flow tube 130 described with reference to FIG. 1. The second and fourth digital signal 614b, 624b can similarly be processed with the second DSP function 634b to determine a second value. The values can be a flow rate of the fluid in the flow tube 130 or any appropriate value.

The first and second value can be averaged by the averaging function 634c to reduce an error rate. For example, the first value can be determined with the first digital signal 614a. In the embodiment shown in FIG. 6, the first value can be determined with the first digital signal 614a by calculating the phase difference between the first digital signal 614a and the third digital signal 624a. The second value can be determined with the second digital signal 614b. In the embodiment shown in FIG. 6, the second value can be determined with the second digital signal 614b by calculating the phase difference between the second digital signal 614b and the fourth digital signal 624b. The first and second value can be provided by the DSP functions 634a, 634b to the averaging function 634c to average the values.

Although the foregoing describes the DSP functions 634a, 634b as determining the values, the DSP functions 634a, 634b can determine the first and second phase difference and provide the determined phase differences to the averaging function 634c. The averaged value can then be determined by the averaging function 634c. For example, a first phase difference determined by the first DSP function 634a can be continuously averaged with the second phase difference determined by the second DSP function 634b. In alternative embodiments, other values can be provided to the averaging function 634c to provide the combined signal 616. Averaging the phase differences, the measurements, or other values can provide an error rate that is less than the error rate in at least one of the digital signals 614a, 614b, 624a, 624b. As a result, the combined signal 616 has a lower error rate than the digital signals 614a, 614b, 624a, 624b.

The foregoing embodiments are examples of an apparatus for reducing an error rate. Other apparatuses can combine the foregoing described and other features to arrive at alternative embodiments. For example, the sensor pairs 510, 520 can be employed with the DSP block 634 described with reference to FIG. 6. Alternatively, the sensors 610, 620 and the analog integrators 631a, 631b can be employed with the DSP block 534 described with reference to FIG. 5. The foregoing and other embodiments can implement a method that reduces an error rate, as will be described in more detail in the following.

Figure 7:
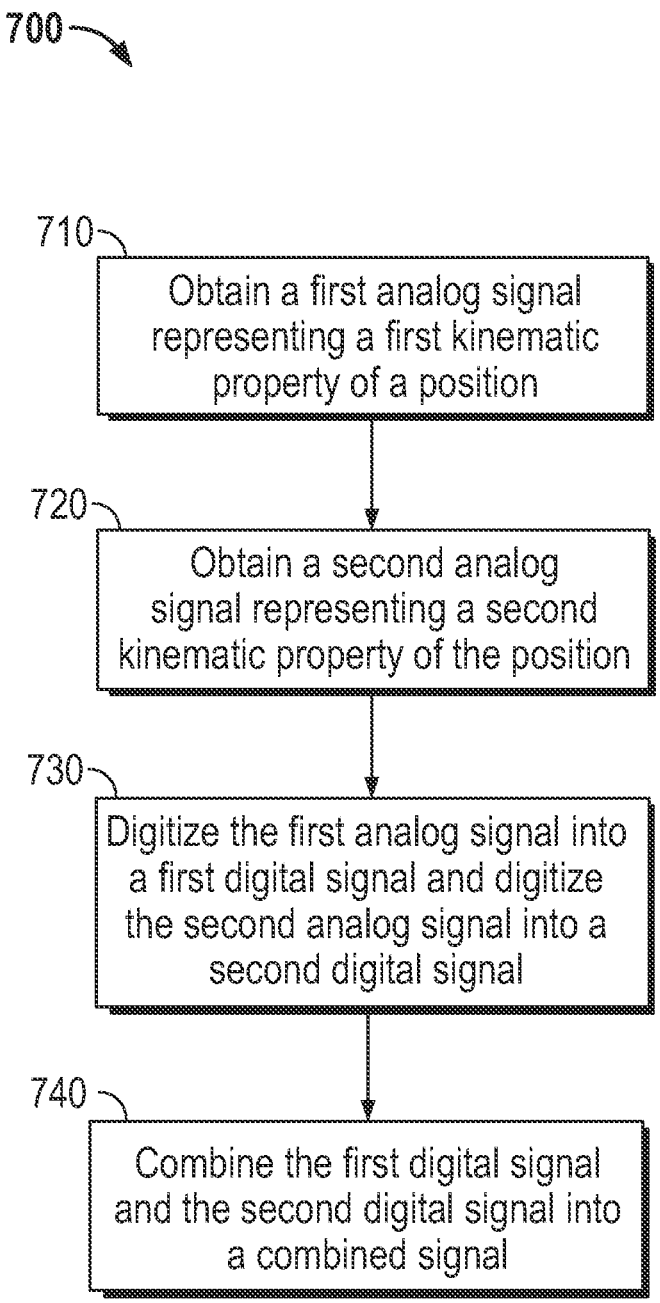
FIG. 7 shows a method 700 for reducing an error rate.

FIG. 7 shows a method 700 for reducing an error rate. Beginning with step 710, the method 700 obtains a first analog signal representing a first kinematic property of a position. The position may be the first position 130a described in the foregoing. In step 720, the method 700 obtains a second analog signal representing a second kinematic property of the position. The second analog signal can be obtained by a second sensor at the position, integrating the first analog signal with an analog integrator, or the like. In the foregoing described and other embodiments, an additional analog signal may be obtained from another sensor at a second position. In step 730, the method 700 digitizes the first analog signal into a first digital signal and digitizes the second analog signal into a second digital signal.

In step 740, the method 700 combines the first digital signal and the second digital signal into a combined signal. The combining of the first and second digital signal may include switching between the first and second digital signal. The combining of the first and second digital signal may also include averaging a first value determined with the one of the first digital signal and the second digital signal and a second value determined with the other of the first digital signal and the second digital signal. In these and other embodiments, the combined signal may be a digital signal, value, or the like.

The first and second digital signal can be combined in a variety of ways. For example, when first and second digital signals are combined along a time-axis, the combined signal may be comprised of sequential portions of the first and second digital signal. This combined signal can be formed by switching between the first and second digital signal within single cycle of the first or second digital signal. The portions of the first and second digital signal can be the portions around the zero crossing points. Accordingly, the combined signal can be a digital sequence that can be employed to determine, for example, a value such as a flow rate.

In another example, the first and second digital signal can be combined by determining a value, such as a scalar value, from each of the first and second digital signal and performing mathematical operations on the two determined values. The mathematical operations may be an addition of the two values and a subsequent division. The combined signal may therefore be a scalar value that is an average of the two values. The mathematical operations can occur digitally in a DSP block, digital computation in a processor in meter electronics, an analog averaging circuit after the DSP block, etc. Accordingly, the combined signal can be a scalar value that is output as, for example, an analog signal whose magnitude corresponds to a parameter, such as a flow rate of fluid in a flow meter.

The embodiments described above provide a method 700 and an apparatus 500, 600 for reducing an error rate. As explained above, the method 700 and the apparatus 500, 600 for reducing the error rate can provide a combined signal 516, 616. The combined signal 516, 616 can be obtained by combining the first digital signal 514a, 614a and the second digital signal 514b, 614b. The error rate in the combined signal 516, 616 can be lower than an error rate in one of the digital signals 514a, 614a, 514b, 614b. The error rate can also be reduced by combining the third digital signal 524a, 624a with the fourth digital signal 524b, 624b. As a result, the error rate in the measurements of, for example, properties of the fluid in the flow tube 130 can be reduced.

In addition, the first digital signal 514a, 614a and the second digital signal 514b, 614b can be combined without significantly increasing the cost and complexity of electronics, such as the meter electronics 530, 630 described in the foregoing. For example, in the embodiment where the first sensor 510a provides the first analog signal 512a, the second analog signal 512b can be provided by adding a second sensor 510b proximate to the first sensor 510a. Adding the second analog signal 512b, 613 may not significantly increase the costs of the meter electronics 530, 630. For example, the second channel CH2 on the ADC 532, 632 may already be available in existing designs. In addition, the DSP block 534 can switch between the first digital signal 514a and the second digital signal 514b without significantly increasing the processing load on the DSP block 534. The DSP block 634 can also perform digital signal processing, such as averaging a phase difference or value, without significantly increasing the processing load on the DSP block 634.

The detailed descriptions of the above embodiments are not exhaustive descriptions of all embodiments contemplated by the inventors to be within the scope of the present description. Indeed, persons skilled in the art will recognize that certain elements of the above-described embodiments may variously be combined or eliminated to create further embodiments, and such further embodiments fall within the scope and teachings of the present description. It will also be apparent to those of ordinary skill in the art that the above-described embodiments may be combined in whole or in part to create additional embodiments within the scope and teachings of the present description.

Thus, although specific embodiments are described herein for illustrative purposes, various equivalent modifications are possible within the scope of the present description, as those skilled in the relevant art will recognize. The teachings provided herein can be applied to other methods and apparatuses for reducing an error rate, and not just to the embodiments described above and shown in the accompanying figures. Accordingly, the scope of the embodiments described above should be determined from the following claims.

We claim:

1. A method for reducing an error rate, the method comprising:
    obtaining a first analog signal representing a first kinematic property of a first position with a sensor at the first position;
    obtaining a second analog signal representing a second kinematic property of the first position;
    digitizing the first analog signal into a first digital signal;
    digitizing the second analog signal into a second digital signal; and
    combining the first digital signal and the second digital signal into a combined signal such that an error rate of the combined signal is less than an error rate of one of the first digital signal and the second digital signal.

2. The method of claim 1, wherein the step of obtaining the second analog signal comprises integrating the first analog signal with an analog integrator.

3. The method of claim 1, wherein the step of obtaining the second analog signal comprises obtaining the second analog signal with an additional sensor at the first position.

4. The method of claim 1, wherein the step of combining the first digital signal and the second digital signal comprises switching between the first digital signal and the second digital signal.

5. The method of claim 1, wherein the step of combining the first digital signal and the second digital signal comprises averaging:
    a first value determined with one of the first digital signal and the second digital signal; and
    a second value determined with the other of the first digital signal and the second digital signal.

6. The method of claim 1, further comprising:
    obtaining a third analog signal representing a first kinematic property of a second position with a sensor at the second position;
    obtaining a fourth analog signal representing a second kinematic property of the second position;
    digitizing the third analog signal into a third digital signal;

digitizing the fourth analog signal into a fourth digital signal; and combining the third digital signal and the fourth digital signal into a combined signal such that an error rate of the combined signal is less than an error rate of one of the third digital signal and the fourth digital signal.

7. The method of claim 1, wherein the step of obtaining the fourth analog signal comprises integrating the third analog signal with an analog integrator.

8. The method of claim 1, wherein the step of obtaining the fourth analog signal comprises obtaining the fourth analog signal with an additional sensor at the second position.

9. The method of claim 1, wherein the first position and the second position are on a flow tube.

10. The method of claim 1, wherein the first analog signal is a velocity signal and the second analog signal is a position signal.

11. The method of claim 1, wherein the third analog signal is a velocity signal and the fourth analog signal is a position signal.

12. An apparatus (500, 600) for reducing an error rate, the apparatus (500, 600) comprising:

a sensor (510a, 610) at a first position (130a); and a meter electronics (530, 630) coupled to and in communication with the sensor (510a, 610), the meter electronics (530, 630) configured to:

obtain a first analog signal (512a, 612) representing a first kinematic property of the first position (130a) from the sensor (510a, 610);

obtain a second analog signal (512b, 613) representing a second kinematic property of the first position (130a);

digitize the first analog signal (512a, 612) into a first digital signal (514a, 614a);

digitize the second analog signal (512b, 613) into a second digital signal (514b, 614b); and combine the first digital signal (514a, 614a) and the second digital signal (514b, 614b) into a combined signal (516, 616) such that an error rate of the combined signal (516, 616) is less than an error rate of one of the first digital signal (514a, 614a) and the second digital signal (514b, 614b).

13. The apparatus (600) of claim 12, wherein the meter electronics (630) obtains the second analog signal (613) by integrating the first analog signal (612) with an analog integrator (631a).

14. The apparatus (500) of claim 12, wherein the meter electronics (530) obtains the second analog signal (512b) from an additional sensor (510b) at the first position (130a).

15. The apparatus (500) of claim 12, wherein the meter electronics (530) combines the first digital signal (514a) and the second digital signal (514b) by switching between the first digital signal (514a) and the second digital signal (514b).

16. The apparatus (600) of claim 12, wherein the meter electronics (630) combines the first digital signal (614a) and the second digital signal (614b) by averaging:

a first value determined with one of the first digital signal (614a) and the second digital signal (614b); and a second value determined with the other of the first digital signal (614a) and the second digital signal (614b).

17. The apparatus (500, 600) of claim 12, wherein the meter electronics (530, 630) is further configured to:

obtain a third analog signal (522a, 622) representing a first kinematic property of a second position (130b) with a sensor (520a) at the second position (130b);

obtain a fourth analog signal (522b, 623) representing a second kinematic property of the second position (130b);

digitize the third analog signal (522a, 622) into a third digital signal (524a, 624a);

digitize the fourth analog signal (522b, 623) into a fourth digital signal (524b, 624b); and combine the third digital signal (524a, 624a) and the fourth digital signal (524b, 624b) into a combined signal (516, 616) such that an error rate of the combined signal (516, 616) is less than an error rate of one of the third digital signal (524a, 624a) and the fourth digital signal (524b, 624b).

18. The apparatus (600) of claim 12, wherein the meter electronics (630) obtains the fourth analog signal (623) by integrating the third analog signal (622) with an analog integrator (631b).

19. The apparatus (500) of claim 12, wherein the meter electronics (530) obtains the fourth analog signal (522b) with an additional sensor (520b) at the second position (130b).

20. The apparatus (500, 600) of claim 12, wherein the first position (130a) and the second position (130b) are on a flow tube (130).

21. The apparatus (500, 600) of claim 12, wherein the first analog signal (512a, 612) is a velocity signal and the second analog signal (512b, 613) is a position signal.

22. The apparatus (500, 600) of claim 12, wherein the third analog signal (522a, 622) is a velocity signal and the fourth analog signal (522b, 623) is a position signal.

* * * * *